(12) United States Patent
Schieck et al.

(10) Patent No.: US 7,842,948 B2
(45) Date of Patent: Nov. 30, 2010

(54) FLIP CHIP SEMICONDUCTOR DIE INTERNAL SIGNAL ACCESS SYSTEM AND METHOD

(75) Inventors: Brian S. Schieck, Hayward, CA (US); Howard Lee Marks, Gilroy, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 10/789,637

(22) Filed: Feb. 27, 2004

(65) Prior Publication Data

US 2005/0191770 A1 Sep. 1, 2005

(51) Int. Cl.
*H01L 29/10* (2006.01)
(52) U.S. Cl. .................... 257/48; 257/690; 257/694; 257/737; 257/780; 257/E23.002
(58) Field of Classification Search ........................ None
See application file for complete search history.

(56) References Cited

U.S. PATENT DOCUMENTS

| 5,258,648 | A | | 11/1993 | Lin ............................. 257/778 |
| 5,262,719 | A | * | 11/1993 | Magdo ..................... 324/158.1 |
| 5,807,763 | A | * | 9/1998 | Motika et al. ................. 438/18 |
| 5,834,844 | A | * | 11/1998 | Akagawa et al. ............ 257/734 |
| 6,081,429 | A | | 6/2000 | Barrett ........................ 361/767 |
| 6,097,087 | A | * | 8/2000 | Farnworth et al. .......... 257/698 |
| 6,133,744 | A | * | 10/2000 | Yojima et al. ............... 324/754 |
| 6,246,252 | B1 | * | 6/2001 | Malladi et al. .............. 324/765 |
| 6,307,162 | B1 | | 10/2001 | Masters et al. .............. 174/262 |
| 6,380,555 | B1 | * | 4/2002 | Hembree et al. .............. 257/48 |
| 6,429,532 | B1 | * | 8/2002 | Han et al. .................... 257/781 |
| 6,472,900 | B1 | * | 10/2002 | Malladi et al. .............. 324/765 |
| 6,534,853 | B2 | * | 3/2003 | Liu et al. ..................... 257/692 |
| 6,590,294 | B1 | * | 7/2003 | Lee et al. ..................... 257/781 |
| 6,686,615 | B1 | | 2/2004 | Cheng et al. ................. 257/208 |
| 6,884,642 | B2 | * | 4/2005 | Farnworth et al. ............. 438/15 |
| 6,933,524 | B2 | * | 8/2005 | Hembree et al. .............. 257/48 |
| 7,523,369 | B2 | * | 4/2009 | Chang ......................... 714/724 |
| 2001/0006233 | A1 | | 7/2001 | Vallett .......................... 257/48 |
| 2001/0010356 | A1 | | 8/2001 | Talbot et al. ................ 250/307 |
| 2003/0119297 | A1 | | 6/2003 | Lam et al. ................... 438/612 |
| 2003/0124816 | A1 | * | 7/2003 | Potts ........................... 438/462 |

FOREIGN PATENT DOCUMENTS

DE 19515591 10/1995

* cited by examiner

*Primary Examiner*—Zandra Smith
*Assistant Examiner*—Khanh B Duong (57) ABSTRACT

A device and method for providing access to a signal of a flip chip semiconductor die. A hole is bored into a semiconductor die to a test probe point. The hole is backfilled with a conductive material, electrically coupling the test probe point to a signal redistribution layer. A conductive bump of the signal redistribution layer is electrically coupled to a conductive contact of a package substrate. An external access point of the package substrate is electrically coupled to the conductive contact, such that signals of the flip chip semiconductor die are accessible for measurement at the external access point.

13 Claims, 6 Drawing Sheets

FLIP CHIP SEMICONDUCTOR DIE INTERNAL SIGNAL ACCESS SYSTEM AND METHOD

FIELD OF THE INVENTION

The present invention relates to the field of integrated circuitry. More particularly, embodiments of the present invention provide a device and method for accessing an internal, electrical signal of a semiconductor die.

BACKGROUND OF THE INVENTION

An important component of integrated circuitry design and manufacturing is the testing and troubleshooting of an integrated circuit. Typically testing involves attempts to analyze internal, electrical signals. The analysis of the signals may be used to inspect circuit performance or to perform failure analysis of the integrated circuit.

One class of integrated circuits includes an active region (e.g., transistors) fabricated in a substrate. In particular, the active region resides close to the top surface of the integrated circuit. Traditional attempts to access signals internal to an integrated circuit often involve use of a Focused Ion Beam (FIB) directly from the top of the integrated circuit for accessing the signals. However, conventional attempts at utilizing FIB approaches for flip chips present significant difficulties.

A flip chip is an integrated circuit in which the active area of the chip is "flipped over" facing downward. Instead of facing up and bonded to the package leads with wires from the outside edges of the chip, the surface of the active area of the flip chip can be used for interconnection, which is typically done through metal bumps of solder. These bumps are soldered onto the package substrate or the circuit board itself and underfilled with epoxy. The flip chip allows for a large number of interconnects with shorter distances than wire, which greatly reduces inductance.

For flip chip devices it is inherently difficult to inspect circuit performance or analyze on-die signals for failure due to limited access to the top of the die. The top of the die is mounted to the package substrate such that the active region of the flip chip device is inaccessible from the top. Attempts to access the active region of the flip chip device by drilling through the underside die substrate is difficult. Typically, the die substrate is significantly thicker than the active region of the integrated circuit. For example, a die substrate may be 700 micrometers (μm), while an active region may be closer to 10 μm. To probe a line of the active region of a flip chip, the FIB must drill a sizeable hole through the die substrate. Drilling through the die substrate requires a significantly greater amount of effort, due to the thickness of the die substrate. Furthermore, since a FIB process is typically very expensive to run, drilling through the underside die substrate is also usually very costly. Moreover, the FIB probe point must be placed very accurately, due to the thickness of the die substrate.

SUMMARY OF THE INVENTION

A device and method for accessing internal signals of a flip chip device are presented. In one embodiment, the present invention provides a semiconductor die (e.g., a flip chip die) that includes a test signal redistribution layer (RDL) trace, a test probe point for accessing signals in the semiconductor die and for electrical coupling to the signal RDL, and a conductive test signal bump for transmitting the signals off of the semiconductor die. The test probe point is accessible by drilling a hole into the semiconductor die. In one embodiment, the test probe point is accessible by focused ion beam drilling and conductive material backfill. The conductive material backfill is electrically coupled to the signal RDL.

In one embodiment, conductive traces are disposed in the signal RDL such that multiple test signals are accessible for testing at various electronic component configuration granularity. In one exemplary implementation the conductive traces are routed in a spiral pattern with conductive fingers located in positions such that drilling and conductive material backfill to lower components provides access to varying degrees of signals between components of the semiconductor die.

In one embodiment, the invention provides a semiconductor device including a package substrate for communicating test signals on an external access point and a semiconductor die having test probe points accessible by the external access point, wherein the semiconductor die is electrically coupled to the package substrate. In one exemplary implementation, the package substrate includes a first surface with ball grid array, a second surface with conductive contacts for electrically coupling with conductive bumps of the semiconductor die, including a conductive test signal bump, and a trace for electrically coupling the conductive test signal bump to the conductive contacts to the external access point.

In another embodiment, the invention includes a semiconductor test process. A boring location aligned to a signal RDL and a probe point in a semiconductor die is determined. In one embodiment, the probe point is electrically coupled to a particular signal trace in the semiconductor die. A hole to the probe point is bored in a first surface of the semiconductor die. The hole is backfilled with conductive material to couple the signal RDL and the probe point. In one embodiment, the boring and the backfilling are performed using a FIB.

A conductive test signal bump on the first surface of the semiconductor die is coupled to a conductive component of a second surface of the package substrate, wherein the conductive test signal bump is electrically coupled to the signal RDL. Test signals are measured at an external access point of the package substrate. In one embodiment, the test signal is an internal semiconductor die signal while the semiconductor die is operating. In one embodiment, the measuring is performed by automatic test equipment.

BRIEF DESCRIPTION OF THE DRAWINGS

The accompanying drawings, which are incorporated in and form a part of this specification, illustrate embodiments of the invention and, together with the description, serve to explain the principles of the invention. The drawings referred to in this description should be understood as not being drawn to scale except if specifically noted.

DETAILED DESCRIPTION

Reference will now be made in detail to the various embodiments of the invention, examples of which are illustrated in the accompanying drawings. While the invention will be described in conjunction with the various embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

It is appreciated that the present invention can be implemented in a variety of embodiments. In one exemplary implementation, the present invention can be utilized in processing systems that support a variety of graphics applications including video games. For example, the present invention can be utilized in a chip set implementing graphics rendering processes of a game console, personal computer, personal digital assistant, cell phone or any number of platforms for implementing a video game. It is also appreciated that references to video game application implementations are exemplary and the present invention is not limited to these implementations.

Figure 1A:
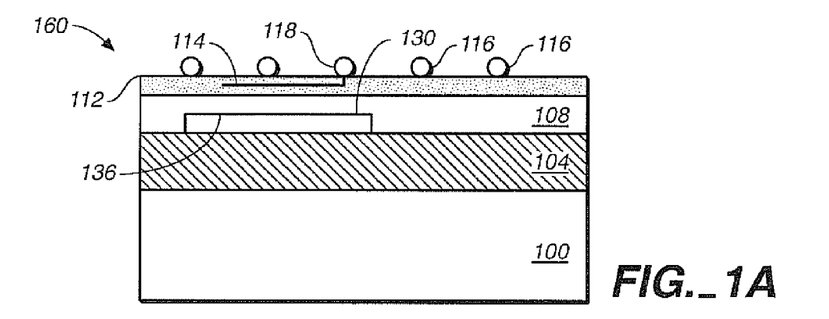
FIG. 1A is a cross-sectional view of a semiconductor die including a test signal redistribution layer (RDL) trace, in accordance with an embodiment of the present invention.

FIG. 1A is a cross-sectional view of semiconductor die 160, in accordance with an embodiment of the present invention. Semiconductor die 160 includes die substrate 100, upon which active region 104 is formed. Active region 104 includes the electronic circuitry of semiconductor die 160, including transistors. It should be appreciated that active region 104 may be formed using a variety of semiconductor fabrication techniques, including photolithography.

Semiconductor die 160 further includes conductive trace layers 108 above active region 104. Conductive trace layers 108 include conductive traces (e.g., conductive trace 130) for electrically coupling electronic circuits of active region 104. The conductive traces are used to convey signals between electronic circuits of active region 104. In one embodiment, conductive trace layers 108 include at least one test probe point 136 for accessing signals of the conductive traces. In one embodiment, test probe point 136 is any point on conductive trace 130. In another embodiment, active region 104 includes at least one test probe point. While the detailed description refers to test probe points of conductive trace layers 108, it should be appreciated that embodiments of the invention can include test probe points in active region 104.

Above conductive trace layers 108 is signal redistribution layer (RDL) 112. Signal RDL 112 includes conductive test signal redistribution layer traces 114 that are configured for electrical coupling to the test probe point of conductive trace layers 108. An exemplary signal RDL in accordance with one embodiment of the present invention is described in FIGS. 3A and 3B.

A plurality of conductive bumps 116 are fabricated above signal RDL 112 for electrically coupling conductive trace layers 108 to conductive traces of a package substrate. The plurality of conductive bumps 116 includes conductive test signal bump 118. Conductive test signal bump 118 is fabricated in signal RDL 112. In one embodiment, conductive test signal bump 118 can be electrically coupled to conductive traces of conductive trace layers 108 through test signal redistribution layer traces 114 of signal RDL 112. For example, conductive test signal bump 118 is electrically coupled to test signal redistribution layer trace 114. It should be appreciated that signal RDL 112 can include any number of test signal redistribution layer traces, and is not limited to the embodiment as shown in FIG. 1A. Test signal redistribution layer trace 114 is configured to be electrically coupled to a test probe point of conductive trace 130, for accessing a test signal (e.g., an internal signal of semiconductor die 160 on conductive trace 130).

Figure 1B:
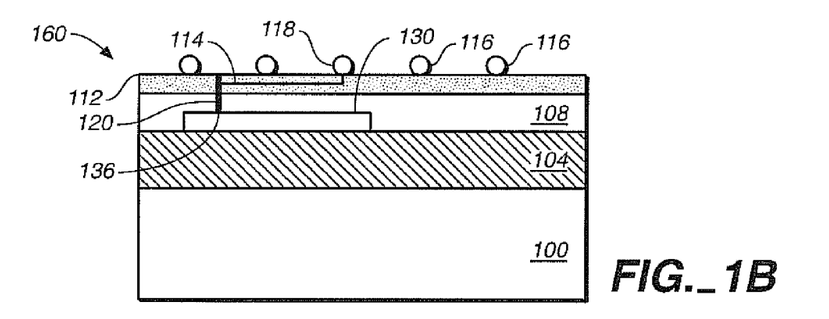
FIG. 1B is a cross-sectional view of a semiconductor die including conductive backfill, in accordance with an embodiment of the present invention.

FIG. 1B is a cross-sectional view of semiconductor die 160 including conductive backfill 120, in accordance with an embodiment of the present invention. In order to access test probe point 136 of conductive trace 130 in conductive trace layers 108, a hole is bored into semiconductor die 160 down to test probe point 136. In one embodiment, the hole is bored using a Focused Ion Beam (FIB). The hole is backfilled with conductive material, forming conductive backfill 120, forming a test access via. Conductive backfill 120 is electrically coupled to test signal redistribution layer trace 114, which is electrically coupled to conductive test signal bump 118. Signals accessed from a test probe point through conductive backfill 120 are moved off of semiconductor die 160 through conductive test signal bump 118. It should be appreciated that conductive backfill 120 can be electrically coupled to a variety of conductive test signal bumps included in conductive bumps 116 for moving signals off of semiconductor die 160. In one embodiment, test probe point 136 is not grounded.

Figure 1C:
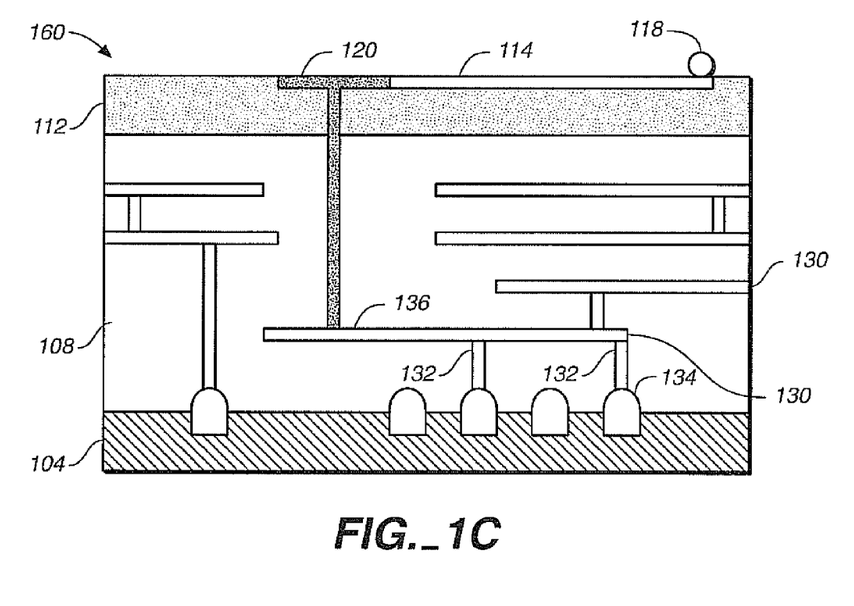
FIG. 1C is a blown-up cross-sectional view of a semiconductor die including conductive backfill, in accordance with an embodiment of the present invention.

FIG. 1C is a blown-up cross-sectional view of semiconductor die 160 including conductive backfill, in accordance with an embodiment of the present invention. As shown in FIG. 1C, conductive trace layer 108 include conductive traces 130. In one embodiment, conductive traces 130 are electrically coupled by conductive material in vias 132. Conductive traces 130 are also electrically coupled to electronic circuit components 134 (e.g., transistors) that are included in electronic circuits of active region 104.

Test probe points 136 are electrically coupled to conductive traces 130. It should be appreciated that test probe points 136 may be conductive traces 130. That is, a test signal can be accessed by electrically coupling to a conductive trace 130. In one embodiment, a test probe point 136 is a portion of a conductive trace 130 that is accessible from a first surface (e.g., the "top" surface) of semiconductor die 160, and is unobstructed by other conductive traces. In one embodiment, test probe point 136 is a portion of conductive trace 130 that provides increased surface area for electric coupling (e.g., the trace is widened and/or a FIB pad is added to conductive trace 130).

A hole is bored into semiconductor die 160 down to test probe point 136. The hole is then backfilled with conductive material (e.g., tungsten, platinum, etc.), forming conductive backfill 120. Conductive backfill 120 electrically couples 130 to test signal redistribution layer trace 114, which is electrically coupled to conductive test signal bump 118. Signals accessed from a test probe point through conductive backfill 120 are moved off of semiconductor die 160 through conductive test signal bump 118.

Figure 2A:
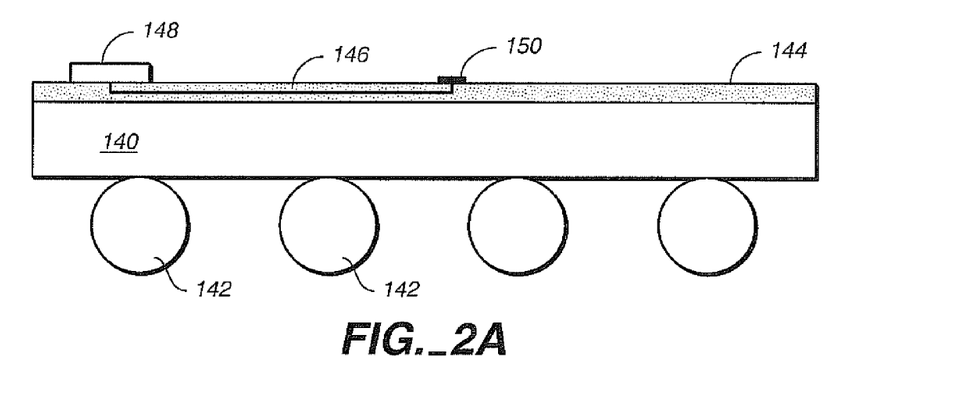
FIG. 2A is a cross-sectional view of a semiconductor package substrate including an external access point, in accordance with an embodiment of the present invention.

FIG. 2A is a cross-sectional view of a semiconductor package substrate 140 including an external access point 148, in accordance with an embodiment of the present invention. Semiconductor package substrate 140 includes a ball grid array (BGA) 142 on the bottom surface. BGA 142 is accessible for electrically coupling semiconductor package substrate 140 to external devices, including a printed circuit board (PCB).

Semiconductor package substrate 140 further includes conductive trace layer 144, including conductive trace 146. It should be appreciated that conductive trace layer 144 may include any number of conductive traces, and is not limited to the embodiment as shown in FIG. 2A. Conductive trace 146 is electrically coupled to conductive contact 150 and external access point 148. In one embodiment, external access point 148 is accessible by a variety of test related equipment (e.g., automatic test equipment (ATE), oscilloscope, logic analyzer, pico probe, etc.). Conductive contact 150 is configured for electrical coupling to conductive test signal bump 118 of FIGS. 1B and 1C. It should be appreciated that conductive trace layer 144 can also include conductive contacts for electrically coupling to other conductive bumps 116 of FIGS. 1B and 1C.

Figure 2B:
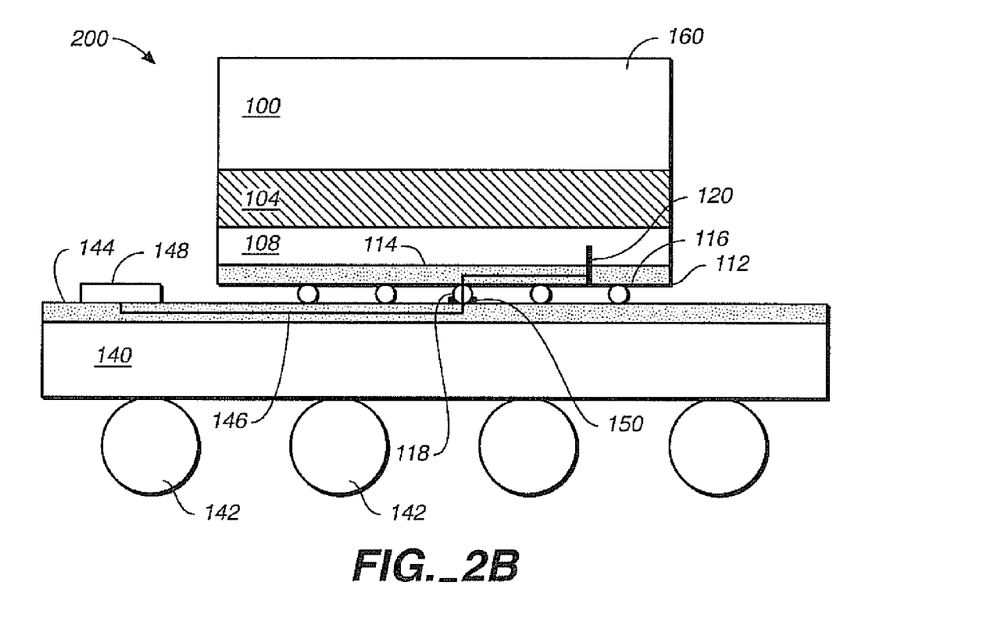
FIG. 2B is a cross-sectional view of a flip chip semiconductor device, in accordance with an embodiment of the present invention.

FIG. 2B is a cross-sectional view of a flip chip semiconductor device 200, in accordance with an embodiment of the present invention. Flip chip semiconductor device 200 includes semiconductor die 160 with conductive backfill 120 of FIG. 1B and semiconductor package substrate 140 of FIG. 2A. Semiconductor die 160 is "flipped over," such that conductive bumps 116, including conductive test signal bump 118, face conductive trace layer 144. In particular, conductive test signal bump 118 is electrically coupled to conductive contact 150. In one embodiment, semiconductor die 160 is fixedly attached to semiconductor package substrate 140. In one embodiment, semiconductor die 160 is fixedly attached to semiconductor package substrate 140 by soldering conductive test signal bump to conductive contact 150 and soldering conductive test signal bumps 116 to other conductive contacts (not shown) of conductive trace layer 144. In one embodiment, the cavity between semiconductor die 160 and semiconductor package substrate 140 is filled with an epoxy.

External access point 148 provides access to a signal from a test probe point of conductive trace layers 108 (e.g., test probe point 136 of FIG. 1C). By forming conductive test trace 114 on semiconductor die 160 and conductive trace 146 on package substrate 140, it is possible to measure the signal without boring a hole through die substrate 100 and active region 104. In another embodiment, conductive contact 150 is electrically coupled to a BGA for accessing a signal from a test probe point.

Figure 3A:
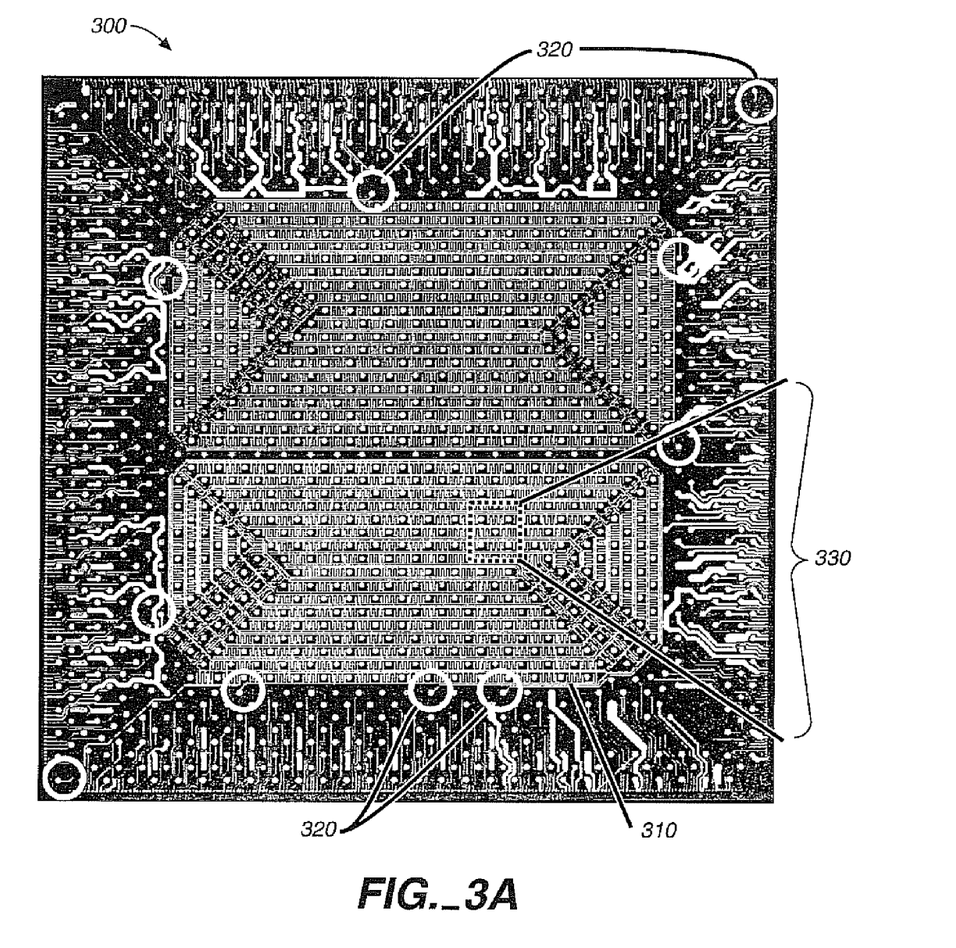
FIG. 3A is a top view of an exemplary signal RDL of a semiconductor device, in accordance with an embodiment of the present invention.

FIG. 3A is a top view of an exemplary signal RDL 300 of a semiconductor device, in accordance with an embodiment of the present invention. In one embodiment, signal RDL 300 is implemented as signal RDL 112 of FIGS. 1A, 1B, 1C and 2B. Signal RDL 300 includes a plurality of conductive traces, including test signal redistribution layer traces 310. As shown, test signal redistribution layer traces 310 are routed in a spiral pattern. In the shown embodiment, there are ten test signal redistribution layer traces 310. However, it should be appreciated that signal RDL 300 can include any number of test signal redistribution layer traces 310. A conductive trace 310 is electrically coupled to conductive test bump 320. In one embodiment, test signal redistribution layer traces 310 are disposed such that multiple test signals are accessible for testing at various electronic component configuration granularity. For example, a semiconductor die can include a number of individual active components communicatively coupled in a variety of hierarchical configurations to form a number of different functional devices (e.g., memory banks, registers, adders, arithmetic logic units, etc.) By facilitating access to internal signals associated with an individual component level or a "higher" hierarchical functional device level, different degrees of testing granularity can be achieved. For example, testing can be performed at a functional device level (e.g., a adder) by accessing a signal at the input to the adder and a signal at the output. The testing can be performed at a logic component level by accessing a signal at the input and a signal at the output of a logic gate included in the adder. The testing can also be performed at the active component level by accessing a signal at the source and a signal at the drain of a transistor included in the logic gate.

Figure 3B:
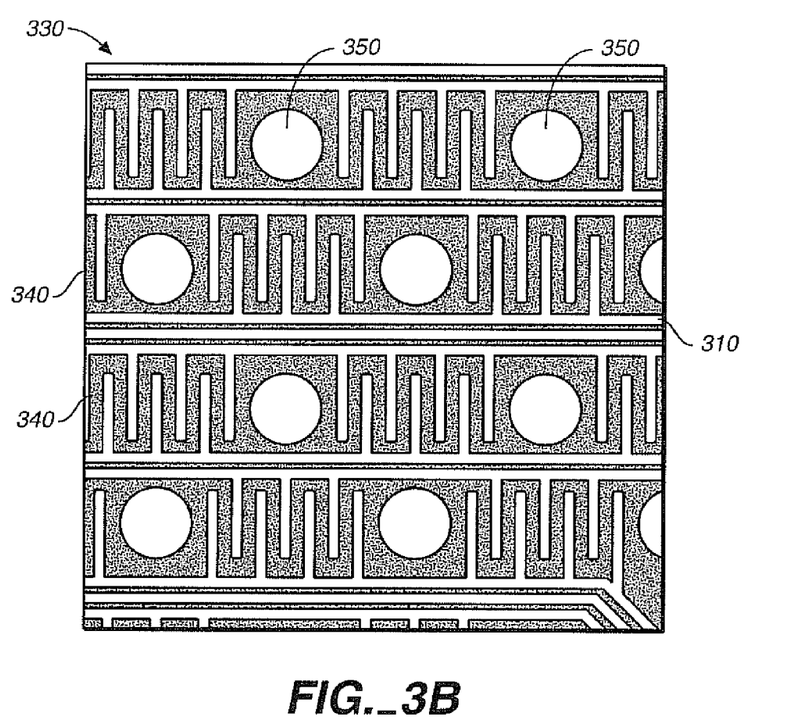
FIG. 3B is an expanded top view of a portion of the exemplary signal RDL of a semiconductor device, in accordance with an embodiment of the present invention.

FIG. 3B is an expanded top view 330 of a portion of the exemplary signal RDL 300, in accordance with an embodiment of the present invention. As shown, test signal redistribution layer traces 310 have conductive fingers 340 electrically coupled thereto. In one embodiment, test signal redistribution layer traces 310 and conductive fingers 340 are routed in patterns in which trace widths and spacing between traces are minimized without causing signal interference, thereby providing access to signals over an increased surface area of the semiconductor die. In one embodiment, test signal redistribution layer traces 310 and conductive fingers 340 are located in positions such that drilling and conductive backfill to components and conductive traces provides access to varying degrees of signals between components of the semiconductor die. Signal RDL 300 also includes conductive bumps 350 which can include a conductive test signal bump.

Figure 4:
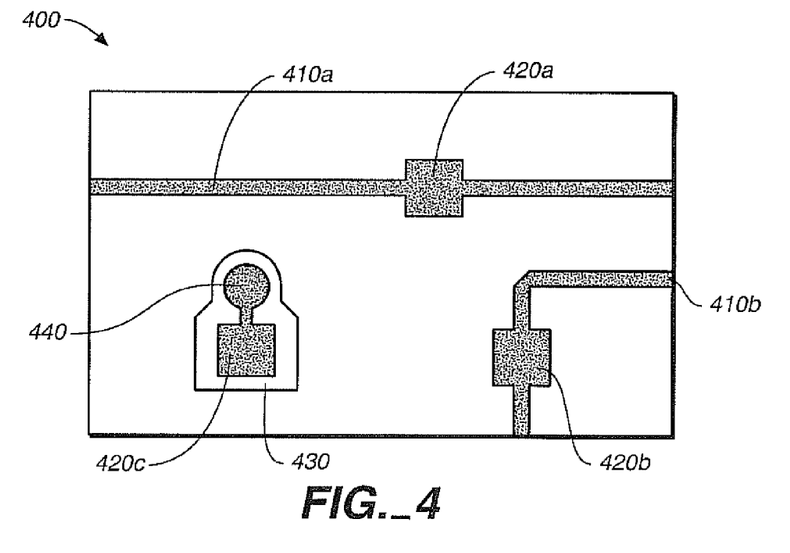
FIG. 4 is a top view of a conductive trace layer including a test probe point of a semiconductor die, in accordance with an embodiment of the present invention.

FIG. 4 is a top view of a conductive trace layer 400 including test probe points 420a-c of a semiconductor die, in accordance with one embodiment of the present invention. In one embodiment, conductive trace layer 400 is located beneath a signal RDL. Conductive trace layer 400 includes conductive traces 410a and 410b. Conductive trace 410a is electrically coupled to test probe point 420a and conductive trace 410b is electrically coupled to test probe point 420b.

Conductive trace layer 400 further includes via 430, through which conductive material 440 is applied. In one embodiment, conductive material 440 is electrically coupled to a conductive trace at a lower conductive trace layer. In another embodiment, conductive material 440 is electrically coupled to an electronic component (e.g., a transistor) in the active region of the semiconductor die. Conductive material 440 is also coupled to test probe point 420c.

Test probe points 420a-c are for accessing signals transmitted over conductive trace 410a, conductive trace 410b, and conductive material 440, respectively. In one embodiment, in order to access test probe points 420a-c, a hole is bored into the semiconductor die down to the particular test probe point of test probe points 420a-c, forming a test access via to the signal RDL. In one embodiment, the hole is bored using a FIB. The hole is backfilled with conductive material, forming a conductive backfill.

Figure 5:
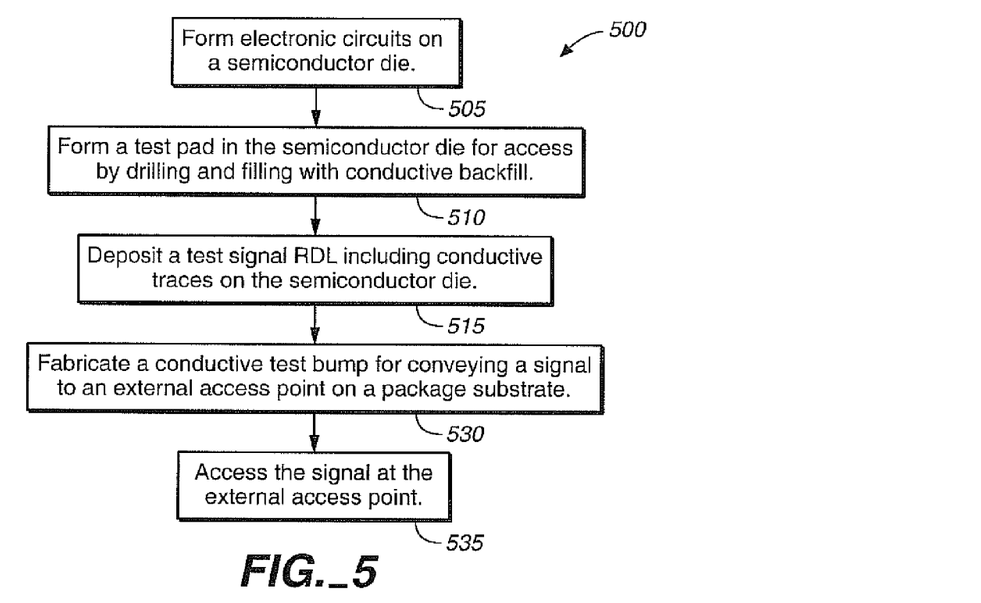
FIG. 5 is a flow chart illustrating a semiconductor fabrication process, in accordance with an embodiment of the present invention.

FIG. 5 is a flow chart illustrating a semiconductor fabrication process 500, in accordance with an embodiment of the present invention. Although specific steps are disclosed in process 500, such steps are exemplary. That is, the embodiments of the present invention are well suited to performing various other steps or variations of the steps recited in FIG. 5. For ease of understanding, process 500 is explained in conjunction with FIG. 1C.

At step 505 of process 500, electronic components are formed on a semiconductor die. In one embodiment, the electronic components are formed in active region 104. It should be appreciated that the electronic components may include any electronic component for use in a semiconductor die, including transistors. It should also be appreciated that the electronic components can be formed using any semiconductor component fabrication technique, including as photolithography.

At step 510, a test pad is formed in the semiconductor die for access by drilling and filling with conductive material backfill. In one embodiment, test probe point 136 is formed, and is electrically coupled to conductive trace 130. It should be appreciated that the test pad can be formed in a conductive trace layer (e.g., conductive trace layers 108) or the active region (e.g., active region 104) and electrically coupled to an electronic component. It should be appreciated that the test pad may be formed using a variety of semiconductor fabrication techniques.

At step 515, a signal RDL including test signal redistribution layer traces is deposited on the semiconductor die. In one embodiment, the conductive traces are disposed such that multiple test signals are accessible for testing at various electronic component configuration granularity, such that different signals associated with individual component, clusters of components, or functional devices can be accessed. In one embodiment, the conductive traces are fabricated in a spiral pattern (e.g., conductive trace 310 of FIG. 3A). In one embodiment, a plurality of conductive fingers (e.g., conductive fingers 340 of FIG. 3B) extending from the conductive traces are fabricated, such that a larger area of said semiconductor die is accessed. It should be appreciated that the signal RDL may be formed using any semiconductor fabrication technique.

At step 530, a conductive test signal bump is fabricated for conveying a signal to an external access point (e.g., an external access test pad) on a package substrate. The conductive test signal bump is located on a first surface of the semiconductor die and is electrically coupled to the signal RDL. In one embodiment, conductive test signal bump 118 as shown in FIG. 1A is electrically coupled to conductive trace 114 of signal RDL 112. In one embodiment, the semiconductor die is a flip chip die configured for connection to the package substrate such that the conductive test signal bump is electrically coupled to a test signal access component of the package substrate, wherein the test signal access component is electrically coupled to the external access point. At step 535, the signal is accessed at the external access point. In one embodiment, the signal is accessed by automatic test equipment, oscilloscope, logic analyzer, pico probe, etc.

Figure 6:
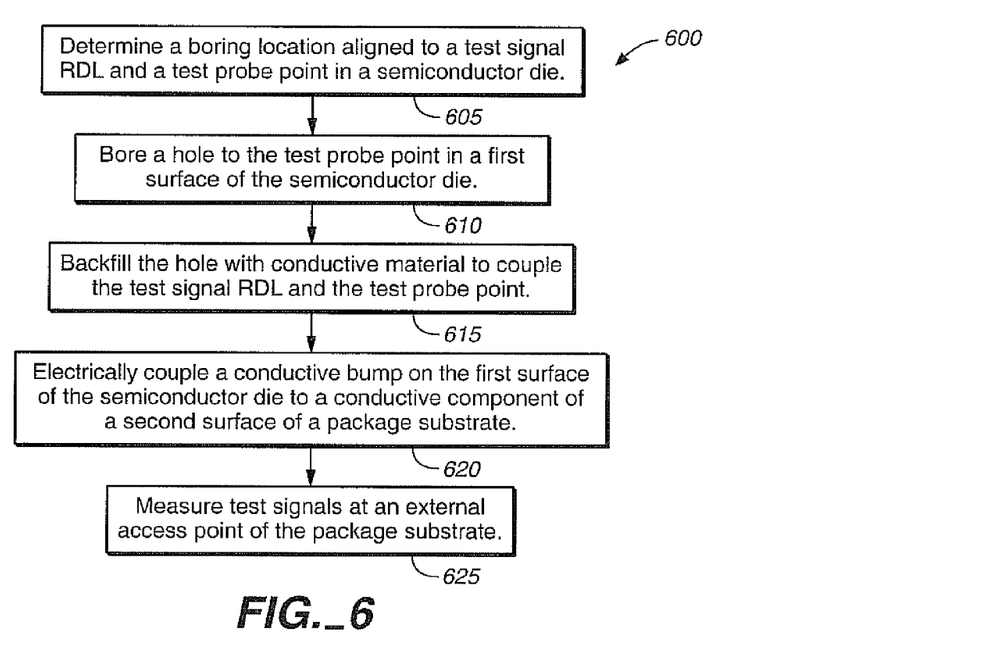
FIG. 6 is a flow chart illustrating a semiconductor test process, in accordance with an embodiment of the present invention.

FIG. 6 is a flow chart illustrating a semiconductor test process 600, in accordance with an embodiment of the present invention. Although specific steps are disclosed in process 600, such steps are exemplary. That is, the embodiments of the present invention are well suited to performing various other steps or variations of the steps recited in FIG. 6. For ease of understanding, process 500 is explained in conjunction with FIGS. 1C, 2B and 3A.

At step 605 of process 600, a boring location aligned to a test signal redistribution layer traces (e.g., 114 of FIG. 1A or 310 of FIG. 3A) and a test probe point (e.g., 136 of FIG. 1A) in a semiconductor die is determined. In order to electrically couple the test signal redistribution layer traces 114 to a desired test probe point, a boring location over the test probe point is determined. For example, as shown in FIG. 3A, a boring location intersecting a conductive trace is determined. In one embodiment, the test probe point is electrically coupled to a particular signal trace in the semiconductor die. In one embodiment, the signal RDL includes a plurality of test signal redistribution layer traces routed in a spiral pattern. In one embodiment, the signal RDL further includes a plurality of conductive fingers extending from the plurality of test signal redistribution layer traces, such that a larger area of a semiconductor die is accessible. For example, the signal RDL can cover central areas of a die not typically covered by an RDL limited to distributing power and/or ground connections to periphery locations. By covering significant areas of a semiconductor die, a signal RDL in accordance with one embodiment of the present invention can thereby providing access to signals over an increased surface area of the semiconductor die.

At step 610, a hole is bored to the test probe point in a first surface of the semiconductor die. In one embodiment, the hole is bored using a FIB. As shown in FIG. 1C, a hole is bored through signal RDL and intersecting test signal redistribution layer trace 114 down to test probe point 136.

At step 615, the hole is backfilled with conductive material to couple the test signal redistribution layer trace of the signal RDL and the probe point. In one embodiment, the conductive material is backfilled using a FIB. It should be appreciated that any conductive material may be used (e.g., tungsten platinum, etc.).

At step 620, a conductive test signal bump on the first surface of the semiconductor die is electrically coupled to a conductive component of a second surface of the package substrate. The conductive test signal bump is electrically coupled to the test signal redistribution layer trace of signal RDL. As shown in FIG. 2B, the semiconductor die is mounted to package substrate 140 such that conductive test signal bump 118 is electrically coupled to conductive contact 150. Conductive test signal bump 118 is electrically coupled to conductive backfill 120 through test signal redistribution layer trace 114. Conductive contact 150 is electrically coupled to external access point 148 through conductive trace 146.

At step 625, the test signals are measured at an external access point of the package substrate. In one embodiment, the test signals are measured by various test equipment. In one embodiment, the test signal is an internal semiconductor die signal while the semiconductor die is operating.

It is appreciated that a present invention device can be incorporated in a various flip chip components included in different electronic systems. For example, a present invention flip chip device can be included in a variety of electronic systems that process information, including a game console, graphics system, communication system, cell phone, computer system, and personal digital assistant (e.g., PDA).

Figure 7:
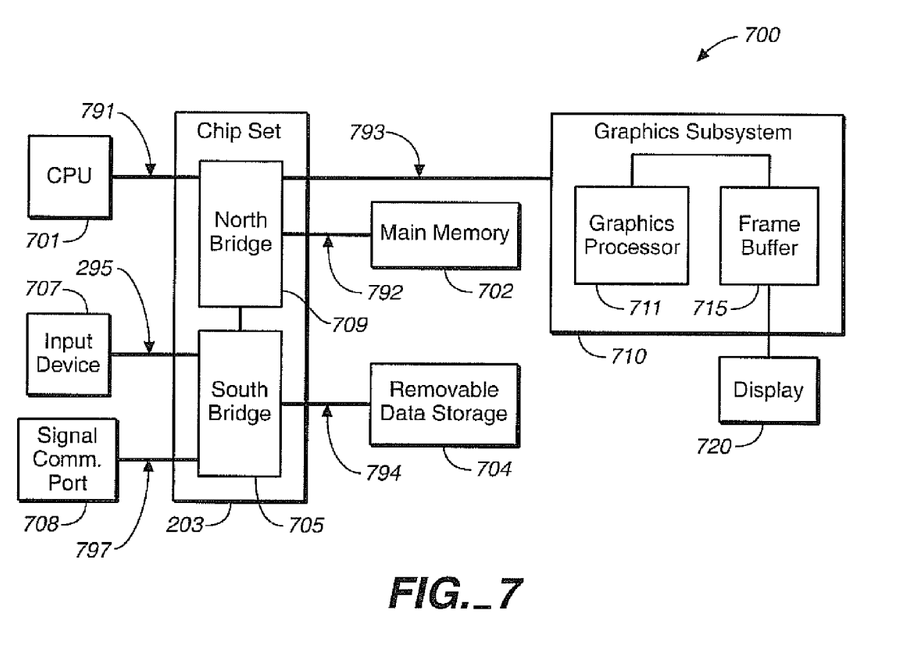
FIG. 7 is a block diagram of one embodiment of a computer system upon which embodiments of the present invention can be implemented.

FIG. 7 is a block diagram of a computer system 700, one embodiment of a computer system upon which embodiments of the present invention can be implemented. Computer system 700 includes central processor unit 701, main memory 702 (e.g., random access memory), chip set 703 with north bridge 709 and south bridge 705, removable data storage device 704, input device 707, signal communications port 708, and graphics subsystem 710 which is coupled to display 720. Computer system 700 includes several busses for communicatively coupling the components of computer system 700. Communication bus 791 (e.g., a front side bus) couples north bridge 709 of chipset 703 to central processor unit 701. Communication bus 792 (e.g., a main memory bus) couples north bridge 709 of chipset 703 to main memory 702. Communication bus 793 (e.g., the Advanced Graphics Port interface) couples north bridge of chipset 703 to graphic subsystem 710. Communication buses 794-797 (e.g., a PCI bus) couple south bridge 705 of chip set 703 to removable data storage device 704, input device 707, and signal communications port 708 respectively. Graphics subsystem 710 includes graphics processor 711 and graphics buffer 715.

The components of computer system 700 cooperatively operate to provide presentations of graphics images. Communications bus 791 through 797 communicate information. Central processor 701 processes information. Main memory 702 stores information and instructions for the central processor 701. Removable data storage device 704 also stores information and instructions (e.g., functioning as a large information reservoir). Input device 706 provides a mechanism for inputting information and/or for pointing to or highlighting information on display 720. Signal communication port 708 provides a communication interface to exterior devices (e.g., an interface with a network). Display device 709 displays information in accordance with data stored in frame buffer 715. Graphics processor 711 processes graphics commands from central processor 701 and provides the resulting data to graphics buffer 715 for storage and retrieval by display monitor 720.

In one embodiment of the present invention, various components of computer system 700 are flip chip devices (e.g., central processor unit 701, main memory 702, components of chip set 703 and components of graphics subsystem 710) in accordance with embodiments of the present invention. In one exemplary implementation, the flip chip devices of computer system 700 include a conductive test signal bump (e.g., 118 of FIG. 1A) for transmitting internal test signals off of said semiconductor die; a test signal redistribution layer trace 114 for communicating the internal test signals to the conductive test signal bump, and a test probe point for accessing test signals in the semiconductor die.

Embodiments of the present invention provide a device and method for accessing internal signals of a flip chip device. By drilling a hole and backfilling the hole with conductive material prior to connecting the semiconductor die to the package substrate, embodiments of the present invention provide a low cost and efficient technique for accessing the internal signals.

Various embodiments of the present invention, a device and method for providing access to a signal of a flip chip semiconductor die, are thus described. While the present invention has been described in particular embodiments, it should be appreciated that the present invention should not be construed as limited by such embodiments, but rather construed according to the below claims.

What is claimed is:

1. A semiconductor die comprising:
   means for transmitting test signals off of said semiconductor die;
   means for communicating said test signals to said means for transmitting test signals off of said semiconductor die, wherein said means for communicating said test signals to said means for transmitting test signals off of said semiconductor die is routed in a spiral pattern included in a redistribution layer and said means for communicating said test signals to said means for transmitting test signals off of said semiconductor die is disposed such that multiple test signals are accessible at varying degrees of electronic component granularity within said die and along said means for communicating said test signals to said means for transmitting test signals off of said semiconductor die, said means for communicating said test signals to said means for transmitting test signals off of said semiconductor die communicatively coupled to said means for transmitting test signals off of said semiconductor die; and
   means for accessing said test signals in said semiconductor die and for electrical coupling a conductor to said redistribution layer.

2. The semiconductor die of claim 1 wherein said semiconductor die is a flip chip die configured for connection to a package substrate such that means for accessing said test signals in said semiconductor die and for electrical coupling a conductor to said redistribution layer is electrically coupled to an external access point of said package substrate.

3. The semiconductor die of claim 1 wherein said means for accessing said test signals in said semiconductor die and for electrical coupling a conductor to said redistribution layer is accessible by drilling from a first surface of said semiconductor die.

4. The semiconductor die of claim 1 wherein said means for accessing said test signals in said semiconductor die and for electrical coupling a conductor to said redistribution layer comprises a focused ion beam (FIB) pad accessible by focused ion beam drilling and conductive material backfill, wherein said FIB pad is communicatively coupled to said means for communicating said test signals to said means for transmitting test signals off of said semiconductor die by said conductive material backfill.

5. The semiconductor die of claim 1 wherein said means for communicating said test signals to said means for transmitting test signals off of said semiconductor die is dedicated for test signals.

6. The semiconductor die of claim 1 wherein said means for communicating said test signals to said means for transmitting test signals off of said semiconductor die is routed in said spiral pattern with conductive fingers located in positions such that drilling and conductive material backfill provides access to internal signals for testing at various electronic component configuration granularity.

7. A semiconductor device comprising:
   means for communicating test signals on an external access point, wherein said means for communicating test signals on an external access point is a package substrate; and
   a semiconductor die having test probe points accessible by said external access point, wherein said semiconductor die is electrically coupled to said package substrate, wherein said semiconductor die comprises:
   means for transmitting internal test signals off of said semiconductor die to said package substrate, wherein said means for transmitting internal test signals off of said semiconductor die to said package substrate is a conductive test signal bump, said conductive test signal bump is located on a first surface of said semiconductor die and electrically coupled to a test signal redistribution layer trace;
   means for communicating internal signals to said conductive test signal bump, wherein said means for communicating internal signals to said conductive test signal bump includes said test signal redistribution layer trace, wherein said test signal redistribution layer trace is routed in a spiral pattern included in a redistribution layer and said test signal redistribution layer trace is disposed such that multiple test signals are accessible at varying degrees of electronic component granularity within said die and along said test signal redistribution layer trace, said test signal redistribution layer trace communicatively coupled said conductive test signal bump;

means for accessing test signals in said semiconductor die and for electrical coupling to said signal redistribution layer, wherein said means for accessing test signals in said semiconductor die and for electrical coupling to said signal redistribution layer is a test probe point; and means for electrically coupling said test probe point to said signal redistribution layer, wherein said means for electrically coupling said test probe point to said signal redistribution layer is a test access via.

8. The semiconductor device of claim 7 wherein said package substrate comprises:

a first surface with ball grid array;

a second surface with conductive contacts for electrically coupling with conductive bumps of said semiconductor die, including a conductive contact for electrically coupling with a conductive test signal bump; and means for electrically coupling one of said conductive contacts to said external access point, wherein said means is a trace.

9. The semiconductor device of claim 8 wherein said external access point is accessible by automatic test equipment.

10. The semiconductor device of claim 7 wherein said test probe point comprises a focused ion beam (FIB) pad accessible by focused ion beam drilling and conductive material backfill.

11. The semiconductor device of claim 7 wherein said test signal redistribution layer trace is routed in patterns in which trace widths and spacing between redistribution layer traces are minimized without causing signal interference.

12. The semiconductor device of claim 7 wherein said test signal redistribution layer trace is routed in said spiral pattern with conductive fingers located in positions such that drilling and conductive material backfill provides access to internal signals for testing at various electronic component configuration granularity.

13. The semiconductor device of claim 7 wherein said test signal is a semiconductor die signal while said semiconductor die is operating.

* * * * *